(12) United States Patent
Onete

(10) Patent No.: US 6,995,608 B2
(45) Date of Patent: Feb. 7, 2006

(54) RECONFIGURABLE ANALOG CELL AND AN ARRANGEMENT COMPRISING A PLURALITY OF SUCH CELL

(75) Inventor: Cristian Nicolae Onete, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 131 days.

(21) Appl. No.: 10/481,982

(22) PCT Filed: Jun. 20, 2002

(86) PCT No.: PCT/IB02/02339

§ 371 (c)(1),
(2), (4) Date: Dec. 23, 2003

(87) PCT Pub. No.: WO03/005583

PCT Pub. Date: Jan. 16, 2003

(65) Prior Publication Data

US 2005/0073873 A1    Apr. 7, 2005

(30) Foreign Application Priority Data

Jun. 29, 2001 (EP) .................................. 01202500

(51) Int. Cl.
*H03K 3/26* (2006.01)

(52) U.S. Cl. ..................... 327/564; 327/565; 326/41; 326/47

(58) Field of Classification Search ................ 327/564, 327/565, 566, 552–559; 326/41, 47
See application file for complete search history.

(56) References Cited

U.S. PATENT DOCUMENTS

| | | | | |
|---|---|---|---|---|
| 5,196,740 A | * | 3/1993 | Austin | ......................... 327/566 |
| 5,966,047 A | * | 10/1999 | Anderson et al. | ........... 327/565 |
| 6,157,214 A | * | 12/2000 | Marshall | ....................... 326/41 |
| 6,765,409 B2 | * | 7/2004 | Vora et al. | ..................... 326/41 |

* cited by examiner

Primary Examiner—Terry D. Cunningham
Assistant Examiner—An T. Luu
(74) Attorney, Agent, or Firm—Michael J. Ure

(57) ABSTRACT

The reconfigurable analog cell according to the invention comprises admittances $y_{ab}$ having first terminals (a) which are coupled to first terminals SW1 of a first plurality of switches, and having second terminals which are coupled to the first terminals SW1 of a second plurality of switches. The switches having second terminals, wherein each one of the second switch terminals SW2 of the first plurality of switches and of the second plurality of switches is coupled to at least one node of a plurality of nodes. In the arrangement only one of the switches from any plurality is ON. Therewith a particular state of a plurality of possible states (PSPPS) of the RAC (100) is defined, each of the states defining a transfer function having the same set of poles.

13 Claims, 10 Drawing Sheets

Figure 1:
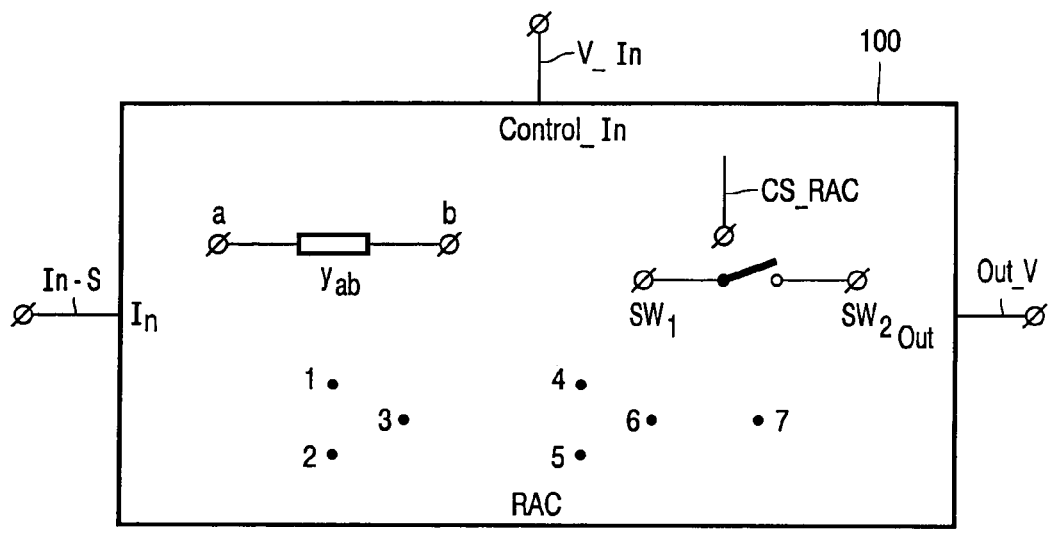

|   | 1 | 2 | 3 | 4 | 5 | 6 | 7 |
|---|---|---|---|---|---|---|---|
| 1 | y22 | 0 | -y27 | -y24 | -y25 | -y26 | -y23 |
| 2 | 0 | y11 | -y17 | -y14 | -y15 | -y16 | -y13 |
| 3 | -y27 | -y17 | y77 | -y47 | -y57 | 0 | 0 |
| 4 | -y24 | -y14 | -y47 | y44 | 0 | -y46 | -y34 |
| 5 | -y25 | -y15 | -y57 | 0 | y55 | -y56 | -y35 |
| 6 | -y26 | -y16 | 0 | -y46 | -y56 | y66 | 0 |
| 7 | -y23 | -y13 | 0 | -y34 | -y35 | 0 | y33 |

Fig.3a

|   | 1 | 2 | 3 | 4 | 5 | 6 | 7 |
|---|---|---|---|---|---|---|---|
| 1 | y22 | 0 | -y27 | -y25 | -y24 | -y23 | -y26 |
| 2 | 0 | y11 | -y17 | -y15 | -y14 | -y13 | -y16 |
| 3 | -y27 | -y17 | y77 | -y57 | -y47 | 0 | 0 |
| 4 | -y25 | -y15 | -y57 | y55 | 0 | -y35 | -y56 |
| 5 | -y24 | -y14 | -y47 | 0 | y44 | -y34 | -y46 |
| 6 | -y23 | -y13 | 0 | -y35 | -y34 | y33 | 0 |
| 7 | -y26 | -y16 | 0 | -y56 | -y46 | 0 | y66 |

Fig.3b

|   | 1 | 2 | 3 | 4 | 5 | 6 | 7 |
|---|---|---|---|---|---|---|---|
| 1 | y11 | 0 | -y16 | -y15 | -y14 | -y13 | -y17 |
| 2 | 0 | y22 | -y26 | -y25 | -y24 | -y23 | -y27 |
| 3 | -y16 | -y26 | y66 | -y56 | -y46 | 0 | 0 |
| 4 | -y15 | -y25 | -y56 | y55 | 0 | -y35 | -y57 |
| 5 | -y14 | -y24 | -y46 | 0 | y44 | -y34 | -y47 |
| 6 | -y13 | -y23 | 0 | -y35 | -y34 | y33 | 0 |
| 7 | -y17 | -y27 | 0 | -y57 | -y47 | 0 | y77 |

Fig.3c

|   | 1 | 2 | 3 | 4 | 5 | 6 | 7 |
|---|---|---|---|---|---|---|---|
| 1 | y11 | 0 | -y16 | -y14 | -y15 | -y17 | -y13 |
| 2 | 0 | y22 | -y26 | -y24 | -y25 | -y27 | -y23 |
| 3 | -y16 | -y26 | y66 | -y46 | -y56 | 0 | 0 |
| 4 | -y14 | -y24 | -y46 | y44 | 0 | -y47 | -y34 |
| 5 | -y15 | -y25 | -y56 | 0 | y55 | -y57 | -y35 |
| 6 | -y17 | -y27 | 0 | -y47 | -y57 | y77 | 0 |
| 7 | -y13 | -y23 | 0 | -y34 | -y35 | 0 | y33 |

Fig.3d

|   | 1    | 2    | 3    | 4    | 5    | 6    | 7    |
|---|------|------|------|------|------|------|------|
| 1 | y22  | 0    | -y23 | -y24 | -y25 | -y27 | -y26 |
| 2 | 0    | y11  | -y13 | -y14 | -y15 | -y17 | -y16 |
| 3 | -y23 | -y13 | y33  | -y34 | -y35 | 0    | 0    |
| 4 | -y24 | -y14 | -y34 | y44  | 0    | -y47 | -y46 |
| 5 | -y25 | -y15 | -y35 | 0    | y55  | -y57 | -y56 |
| 6 | -y27 | -y17 | 0    | -y47 | -y57 | y77  | 0    |
| 7 | -y26 | -y16 | 0    | -y46 | -y56 | 0    | y66  |

Fig.3e

|   | 1    | 2    | 3    | 4    | 5    | 6    | 7    |
|---|------|------|------|------|------|------|------|
| 1 | y22  | 0    | -y23 | -y25 | -y24 | -y26 | -y27 |
| 2 | 0    | y11  | -y13 | -y15 | -y14 | -y16 | -y17 |
| 3 | -y23 | -y13 | y33  | -y35 | -y34 | 0    | 0    |
| 4 | -y25 | -y15 | -y35 | y55  | 0    | -y56 | -y57 |
| 5 | -y24 | -y14 | -y34 | 0    | y44  | -y46 | -y47 |
| 6 | -y26 | -y16 | 0    | -y56 | -y46 | y66  | 0    |
| 7 | -y27 | -y17 | 0    | -y57 | -y47 | 0    | y77  |

Fig.3f

|   | 1    | 2    | 3    | 4    | 5    | 6    | 7    |
|---|------|------|------|------|------|------|------|
| 1 | y11  | 0    | -y17 | -y15 | -y14 | -y16 | -y13 |
| 2 | 0    | y22  | -y27 | -y25 | -y24 | -y26 | -y23 |
| 3 | -y17 | -y27 | y77  | -y57 | -y47 | 0    | 0    |
| 4 | -y15 | -y25 | -y57 | y55  | 0    | -y56 | -y35 |
| 5 | -y14 | -y24 | -y47 | 0    | y44  | -y46 | -y34 |
| 6 | -y16 | -y26 | 0    | -y56 | -y46 | y66  | 0    |
| 7 | -y13 | -y23 | 0    | -y35 | -y34 | 0    | y33  |

Fig.3g

|   | 1    | 2    | 3    | 4    | 5    | 6    | 7    |
|---|------|------|------|------|------|------|------|
| 1 | y11  | 0    | -y17 | -y14 | -y15 | -y13 | -y16 |
| 2 | 0    | y22  | -y27 | -y24 | -y25 | -y23 | -y26 |
| 3 | -y17 | -y27 | y77  | -y47 | -y57 | 0    | 0    |
| 4 | -y14 | -y24 | -y47 | y44  | 0    | -y34 | -y46 |
| 5 | -y15 | -y25 | -y57 | 0    | y55  | -y35 | -y56 |
| 6 | -y13 | -y23 | 0    | -y34 | -y35 | y33  | 0    |
| 7 | -y16 | -y26 | 0    | -y46 | -y56 | 0    | y66  |

Fig.3h

Fig.3i

|   | 1    | 2    | 3    | 4    | 5    | 6    | 7    |
|---|------|------|------|------|------|------|------|
| 1 | y22  | 0    | -y26 | -y24 | -y25 | -y23 | -y27 |
| 2 | 0    | y11  | -y16 | -y14 | -y15 | -y13 | -y17 |
| 3 | -y26 | -y16 | y66  | -y46 | -y56 | 0    | 0    |
| 4 | -y24 | -y14 | -y46 | y44  | 0    | -y34 | -y47 |
| 5 | -y25 | -y15 | -y56 | 0    | y55  | -y35 | -y57 |
| 6 | -y23 | -y13 | 0    | -y34 | -y35 | y33  | 0    |
| 7 | -y27 | -y17 | 0    | -y47 | -y57 | 0    | y77  |

Fig.3j

|   | 1    | 2    | 3    | 4    | 5    | 6    | 7    |
|---|------|------|------|------|------|------|------|
| 1 | y22  | 0    | -y26 | -y25 | -y24 | -y27 | -y23 |
| 2 | 0    | y11  | -y16 | -y15 | -y14 | -y17 | -y13 |
| 3 | -y26 | -y16 | y66  | -y56 | -y46 | 0    | 0    |
| 4 | -y25 | -y15 | -y56 | y55  | 0    | -y57 | -y35 |
| 5 | -y24 | -y14 | -y46 | 0    | y44  | -y47 | -y34 |
| 6 | -y27 | -y17 | 0    | -y57 | -y47 | y77  | 0    |
| 7 | -y23 | -y13 | 0    | -y35 | -y34 | 0    | y33  |

Fig.3k

|   | 1    | 2    | 3    | 4    | 5    | 6    | 7    |
|---|------|------|------|------|------|------|------|
| 1 | y11  | 0    | -y13 | -y15 | -y14 | -y17 | -y16 |
| 2 | 0    | y22  | -y23 | -y25 | -y24 | -y27 | -y26 |
| 3 | -y13 | -y23 | y33  | -y35 | -y34 | 0    | 0    |
| 4 | -y15 | -y25 | -y35 | y55  | 0    | -y57 | -y56 |
| 5 | -y14 | -y24 | -y34 | 0    | y44  | -y47 | -y46 |
| 6 | -y17 | -y27 | 0    | -y57 | -y47 | y77  | 0    |
| 7 | -y16 | -y26 | 0    | -y56 | -y46 | 0    | y66  |

Fig.3l

|   | 1    | 2    | 3    | 4    | 5    | 6    | 7    |
|---|------|------|------|------|------|------|------|
| 1 | y11  | 0    | -y13 | -y14 | -y15 | -y16 | -y17 |
| 2 | 0    | y22  | -y23 | -y24 | -y25 | -y26 | -y27 |
| 3 | -y13 | -y23 | y33  | -y34 | -y35 | 0    | 0    |
| 4 | -y14 | -y24 | -y34 | y44  | 0    | -y46 | -y47 |
| 5 | -y15 | -y25 | -y35 | 0    | y55  | -y56 | -y57 |
| 6 | -y16 | -y26 | 0    | -y46 | -y56 | y66  | 0    |
| 7 | -y17 | -y27 | 0    | -y47 | -y57 | 0    | y77  |

|   | 1+2 | 3 | 4+5 | 6 |
|---|---|---|---|---|
| 1 | y11 | -y13 | -y14-y15 | -y16 |
| 2 | y22 | -y23 | -y24-y25 | -y26 |
| 4 | -y14-y24 | -y34 | y44 | -y46 |
| 5 | -y15-y25 | -y35 | y55 | -y56 |

Fig.5a

|   | 1+2 | 3 | 4+5 | 6 |
|---|---|---|---|---|
| 1 | y22 | -y27 | -y24-y25 | -y26 |
| 2 | y11 | -y17 | -y14-y15 | -y16 |
| 4 | -y24-y14 | -y47 | y44 | -y46 |
| 5 | -y25-y15 | -y57 | y55 | -y56 |

Fig.5b

|   | 1+2 | 3 | 4+5 | 6 |
|---|---|---|---|---|
| 1 | y22 | -y27 | -y25-y24 | -y23 |
| 2 | y11 | -y17 | -y15-y14 | -y13 |
| 4 | -y25-y15 | -y57 | y55 | -y35 |
| 5 | -y24-y14 | -y47 | y44 | -y34 |

Fig.5c

|   | 1+2 | 3 | 4+5 | 6 |
|---|---|---|---|---|
| 1 | y11 | -y16 | -y15-y14 | -y13 |
| 2 | y22 | -y26 | -y25-y24 | -y23 |
| 4 | -y15-y25 | -y56 | y55 | -y35 |
| 5 | -y14-y24 | -y46 | y44 | -y34 |

Fig.5d

|   | 1+2 | 3 | 4+5 | 6 |
|---|---|---|---|---|
| 1 | y11 | -y16 | -y14-y15 | -y17 |
| 2 | y22 | -y26 | -y24-y25 | -y27 |
| 4 | -y14-y24 | -y46 | y44 | -y47 |
| 5 | -y15-y25 | -y56 | y55 | -y57 |

Fig.5e

|   | 1+2 | 3 | 4+5 | 6 |
|---|---|---|---|---|
| 1 | y22 | -y23 | -y24-y25 | -y27 |
| 2 | y11 | -y13 | -y14-y15 | -y17 |
| 4 | -y24-y14 | -y34 | y44 | -y47 |
| 5 | -y25-y15 | -y35 | y55 | -y57 |

Fig.5f

Fig.5g

|   | 1+2      | 3    | 4+5         | 6    |
|---|----------|------|-------------|------|
| 1 | y22      | -y23 | -y25-y24    | -y26 |
| 2 | y11      | -y13 | -y15-y14    | -y16 |
| 4 | -y25-y15 | -y35 | y55         | -y56 |
| 5 | -y24-y14 | -y34 | y44         | -y46 |

Fig.5h

|   | 1+2      | 3    | 4+5         | 6    |
|---|----------|------|-------------|------|
| 1 | y11      | -y17 | -y15-y14    | -y16 |
| 2 | y22      | -y27 | -y25-y24    | -y26 |
| 4 | -y15-y25 | -y57 | y55         | -y56 |
| 5 | -y14-y24 | -y47 | y44         | -y46 |

Fig.5i

|   | 1+2      | 3    | 4+5         | 6    |
|---|----------|------|-------------|------|
| 1 | y11      | -y17 | -y14-y15    | -y13 |
| 2 | y22      | -y27 | -y24-y25    | -y23 |
| 4 | -y14-y24 | -y47 | y44         | -y34 |
| 5 | -y15-y25 | -y57 | y55         | -y35 |

Fig.5j

|   | 1+2      | 3    | 4+5         | 6    |
|---|----------|------|-------------|------|
| 1 | y22      | -y26 | -y24-y25    | -y23 |
| 2 | y11      | -y16 | -y14-y15    | -y13 |
| 4 | -y24-y14 | -y46 | y44         | -y34 |
| 5 | -y25-y15 | -y56 | y55         | -y35 |

Fig.5k

|   | 1+2      | 3    | 4+5         | 6    |
|---|----------|------|-------------|------|
| 1 | y22      | -y26 | -y25-y24    | -y27 |
| 2 | y11      | -y16 | -y15-y14    | -y17 |
| 4 | -y25-y15 | -y56 | y55         | -y57 |
| 5 | -y24-y14 | -y46 | y44         | -y47 |

Fig.5l

|   | 1+2      | 3    | 4+5         | 6    |
|---|----------|------|-------------|------|
| 1 | y11      | -y13 | -y15-y14    | -y17 |
| 2 | y22      | -y23 | -y25-y24    | -y27 |
| 4 | -y15-y25 | -y35 | y55         | -y57 |
| 5 | -y14-y24 | -y34 | y44         | -y47 |

RECONFIGURABLE ANALOG CELL AND AN ARRANGEMENT COMPRISING A PLURALITY OF SUCH CELL

The invention relates to a reconfiguable analog cell according to the preamble of claim 1.

The invention further relates to an arrangement comprising the reconfigurable analog cells.

Reconfigurable circuits, especially that used in digital applications, are widely used in digital logic design because they can be easily reconfigured in order to obtain different digital functions, realizing different digital functions using the same internal architecture. The flexibility in applications is further given by the fact that their internal architecture can be easily modified using dedicated computer programs.

In analog design, reconfigurable circuits are more difficult to be obtained because they need passive components of different values and active components as, for example Operational Amplifiers (OAs) to be integrated on the same chip. Furthermore, if such a reconfigurable cell is designed it must be re-programmable i.e. the input-output (I/O) function must be easily modifiable as well as the component values.

Because of the market success of the field programmable gate arrays (FPGA) their model was used in realizing a field programmable analog array (FPAA) s described in document "AN10E40—Data Manual", pages 1 to 31, published by Anadigm Inc. in 2000.

The above mentioned document describes a FPAA having 20 Configurable Analog Blocks (CAB) arranged in a matrix with 5 columns and 4 lines. Each CAB comprises switched capacitor banks, local routing resources, local switching and clocking resources, global connection points and one OA. Each cell can realize different I/O functions including the Sallen-Key active filter. The Sallen-Key active filter uses one OA. Configurations of active filters with two or more OAs cannot be obtained with the FPAA described in the said document using a single CAB. It should be pointed out here that from the practical point of view there should be considered active filters with at least two OAs, because the spread of their component values is relatively low and they can realize filters with a relatively high quality factor (Q). In the same time, passive filters are better options from the sensitivity point of view, i.e. stability with respect to the variation of external parameters as temperature e.g. and passive filters can be used instead of active ones if suitable amplification and buffering are provided. So that it is desirable to be able to design analog filters that maintain the re-configurability properties. Furthermore, for a specific application, in a specified frequency range, it is desirable to realize different transfer functions with the same pole displacement but realizing different transfer functions.

It is therefore an object of the present invention to provide a reconfigurable analog cell conceived to realize different transfer functions having almost the same pole displacement.

In accordance with the invention, this object is achieved in a device as described in the introductory paragraph, which is characterized in that each of the first terminals of the admittance $y_{ab}$ is coupled to the first terminals of the first plurality of switches, each of the second terminals of the admittance $y_{ab}$ is coupled to the first terminals of the second plurality of switches, each one of the second switch terminal of the first plurality of switches and of the second plurality of switches is coupled to at least one node of the plurality of nodes, the arrangement being such that when a control vector V_In is applied through the Control_In only one of the switches from any plurality is ON, realizing a particular state of a plurality of possible states (PSPPS) of the RAC, each of the circuits resulting from the plurality of states having the above mentioned set of poles.

The device according to the invention has the advantage that the reconfigurable analog cell realizes different transfer functions having the same pole displacement.

In one preferred embodiment of the invention a change of the control vector V_In, applied to the control inputs of the first plurality of switches and to the control inputs of the second plurality of switches of the said particular state of the cell, generates either a second state of the RAC, wherein the admittances connected to a first node (1) in the said particular state PSPPS are connected to a second node (2) and reciprocally, the admittances connected to a third node (3) in the said particular state PSPPS are connected to the reference node and reciprocally, or a third state of the RAC (100), in the third state:

the admittances connected to a fourth node (4) in the said particular state PSPPS are connected to a fifth node (5) and reciprocally, the admittances connected to a sixth node (6) in the said particular state PSPPS are connected to the reference node and reciprocally.

The above-described mechanism realizes an even pair of permutations in the Indefinite Admittance Matrix characterizing the cell and thus the determinant of the circuit remains unchanged. As a matter of consequence, the pole displacement of the transfer function of the circuit remains unchanged, in the same time the circuits realizing different transfer functions. This mechanism is known in the specialized literature as Complementary Transformation as used, for example in N. Fliege, "Complementary transformation of feedback systems", IEEE Trans. Circ. Theory, vol. CT-20, pp. 137–139, 1973.

In an embodiment of the invention the reconfigurable analog cell further comprises a decoder means having a decoder input and a decoder output, the decoder input being coupled to the first control input and the decoder output being coupled to the control terminals of the switches for generating at the decoder output a decoder output vector depending on the first control vector applied at the first control input for controlling the state of the switches. It is observed that if the cell has a relatively large number of switches the control vector should be as large as the number of switches, which is impractical, in real world situations. Therefore, providing a decoder means and supposing that there are NSW switches then the total number of necessary control vector signals is the biggest integer number that approaches $\log_2(NSW)$, which is much lower that NSW. For example if there are 15 switches to be controlled, the control vector must have only 4 components. This feature is especially important when the switches are controlled via a controller bus.

In an embodiment of the invention the reconfigurable analog cell is characterized in that the first node is coupled to a first input terminal of a first Differential Voltage Controlled Voltage Source, the second node is coupled to a second input terminal of the first Differential Voltage Controlled Source, the fourth node is coupled to a third input terminal of a second Differential Voltage Controlled Source, the fifth node is coupled to a fourth input terminal of the second Differential Voltage Controlled Source. In the same time the third node is coupled to a first output terminal of the first Differential Voltage Controlled Source and the sixth node is coupled to a second output terminal of the second Differential Voltage Controlled Source. The Differential Voltage Controlled Sources are characterized in that they have a relatively very high input impedance, a relatively very low output impedance and a relative very high gain. These features allow us to use the Nathan's transformation that is well known in the technical literature as in Mitra S. K. "Analysis and Design of Linear Active Networks", Wiley, N.Y., 1969. In accordance with this algorithm the indefinite admittance matrix of the circuits can be simplified as follows:

columns 1 and 2 are added together and one of them is eliminated,
  columns 4 and 5 are added together and one of them is eliminated,
  line 3 and line 6 are eliminated.

It is easy to observe that the order of indefinite admittance matrix is reduced with 2 and, furthermore, an active filter with two OAs is obtained.

It is another object of the invention to provide an arrangement comprising a plurality of reconfigurable analog cells that are coupled to an Input Selection Means (ISM) and to an Output Selection Means (OSM). The input selection means is controlled by a second input control vector applied to a second control input of the input selection means and the output selection means is controlled by a third control vector applied to a third control input of the output selection means. The input selection means further comprises a first plurality of ISM inputs and a second plurality of ISM outputs for selectively redirecting an input vector of signals received at the first plurality of ISM inputs to the second plurality of ISM outputs for transmitting them to the inputs of the plurality of reconfigurable analog cells under the control of the second input control vector. The OSM comprises a first plurality of OSM inputs, a second plurality of OSM outputs and a third plurality of OSM outputs for selectively redirecting an input vector of signals comprising the output signals generated by the plurality of reconfigurable analog cells to the second plurality of OSM outputs for transmitting a general output signal and to the third plurality of OSM outputs for transmitting a vector to the first plurality of ISM inputs under the control of the third control vector V_OSM.

It should be emphasized here that the above-described arrangement represents a matrix of reconfigurable analog cells that could be used in a very flexible way. When applying an input signal at one of the first plurality of ISM inputs it is redirected, under the control of the second control vector, to the input of a reconfigurable analog cell. The output signals obtained at the output of the reconfigurable cell are inputted to the first plurality of OSM inputs. These signals are directed either to the second plurality of OSM outputs, if the analog reconfigurable cell realizes the desired transfer function, or to the third plurality of OSM outputs for redirecting them to the first ISM inputs. These signals are further redirected by the ISM to another analog reconfigurable cell in order to obtain the desired transfer function. In this way a higher order filter can be designed.

In a preferred embodiment in the above mentioned arrangement the ISM further comprises a first multiplexing means coupled to a first controllable amplifier means comprising a first amplifier input, a first amplifier output and a first amplifier control input. The ISM is used for selectively amplifying and transmitting the input vector of signals received at the first plurality of inputs through the first controllable amplifier means to the second plurality of ISM outputs under the control of the second control vector. The first multiplexing means couples the input signals applied at the first plurality of ISM inputs to the second plurality of ISM outputs via the first controllable amplifier means. The amplifier means are necessary either for buffering the signals source that could be received either from an external source or from some of the third plurality of OSM outputs, or for amplifying the input signals in a controllable way under the control of the second control vector. This last feature is very useful when an attenuation of the signals occurs.

In another embodiment of the arrangement of the invention the OSM further comprises a second multiplexing means coupled to a second controllable amplifier means comprising a second amplifier input, a second amplifier output and a second amplifier control input. The OSM is used for selectively amplifying and transmitting the output signals transmitted by the plurality of RAC under the control of the third control vector to the third plurality of OSM output and to the second plurality of OSM output. As in the ISM case, the second plurality of amplifier means are necessary either for buffering the outputs of the reconfigurable analog cell, or for amplifying the input signals in a controllable way under the control of the third control vector.

Figure 2:
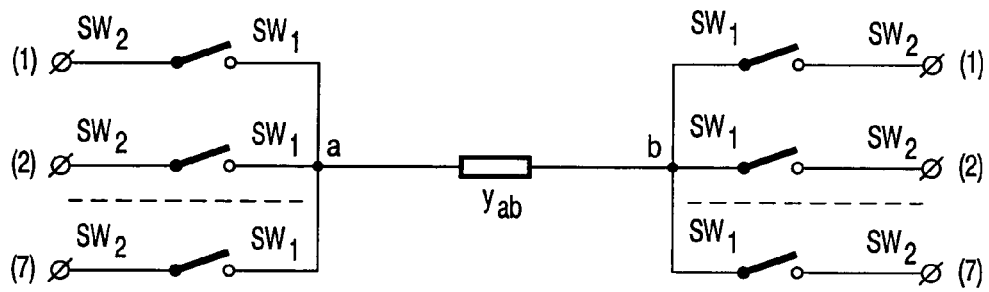
Figure 4:
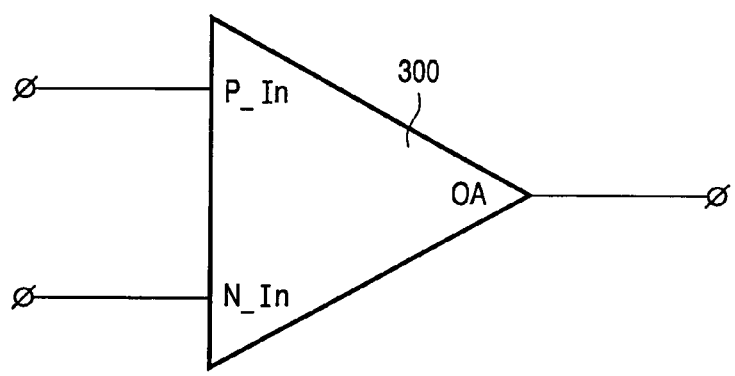
Figure 6:
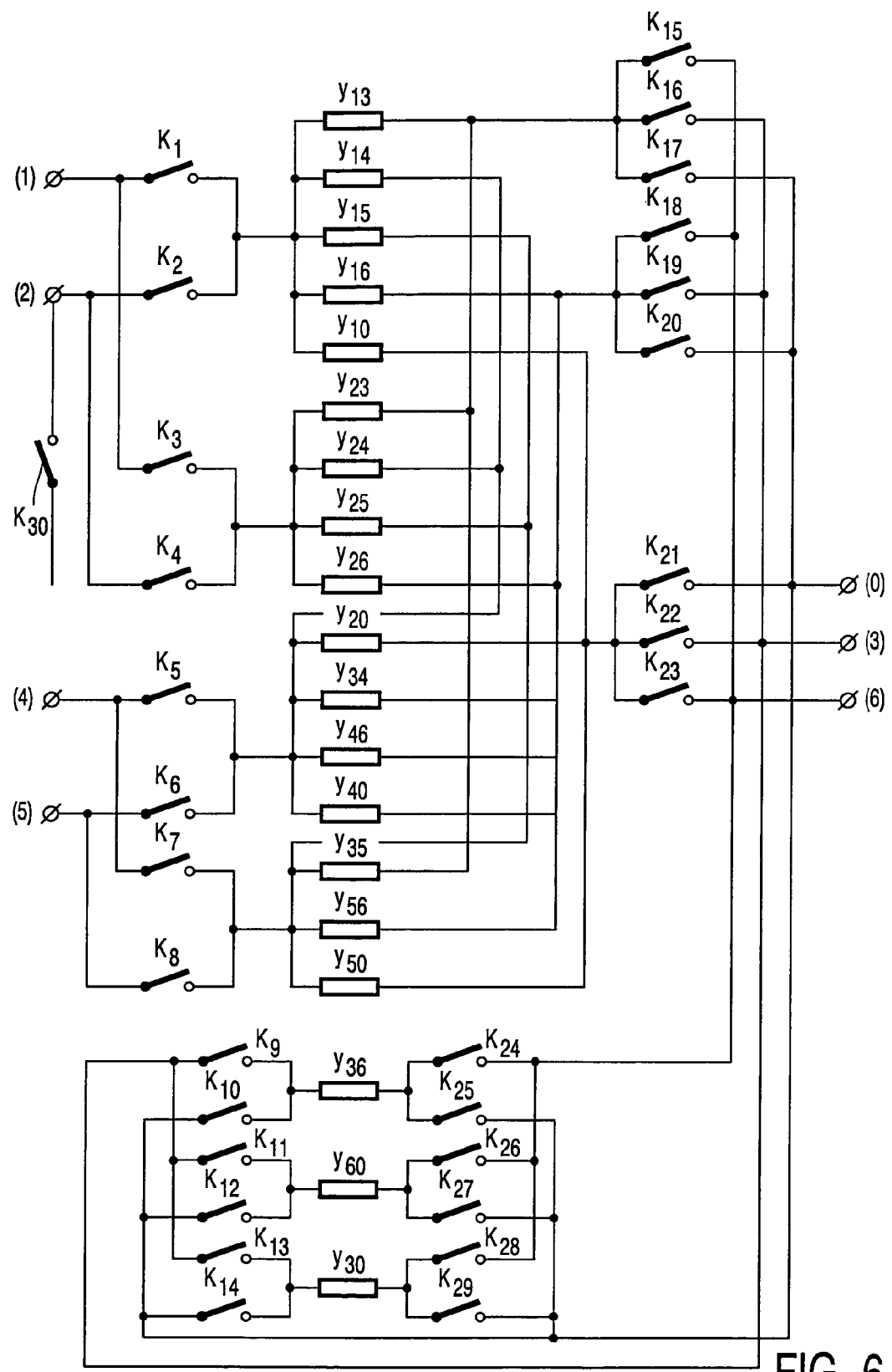
Figure 7:
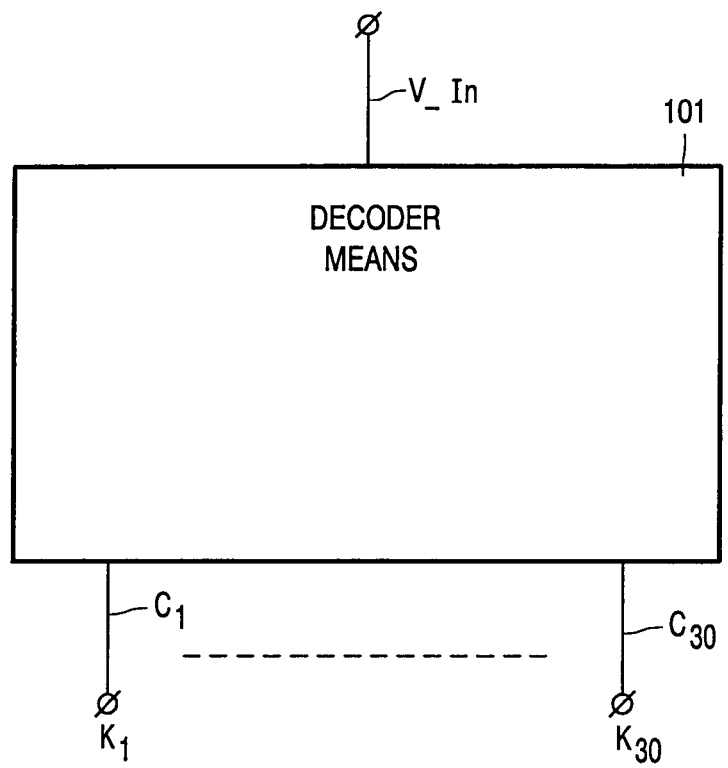
Figure 9:
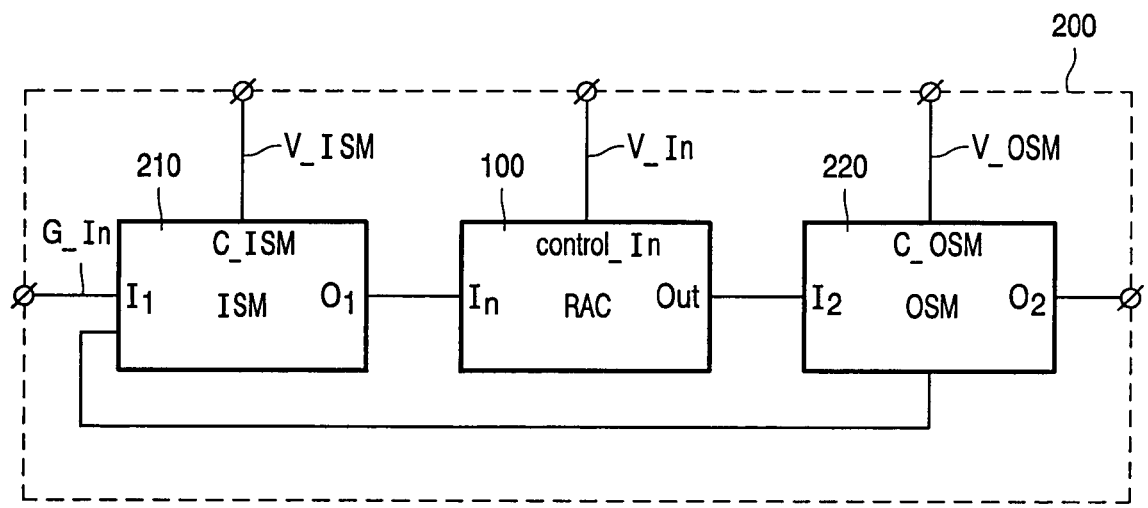
Figure 8A:
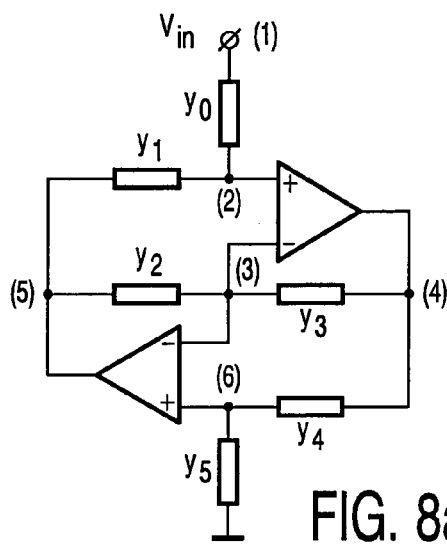
Figure 8B:
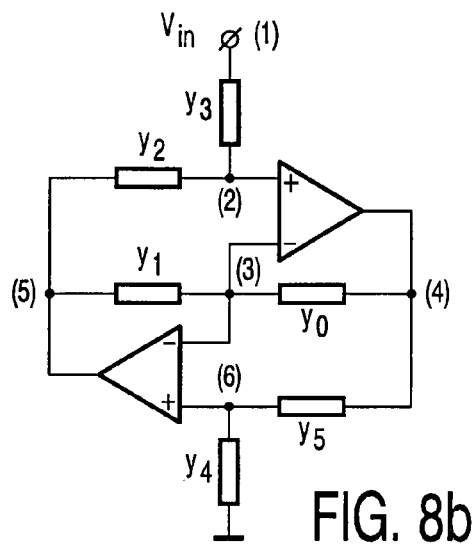
Figure 8C:
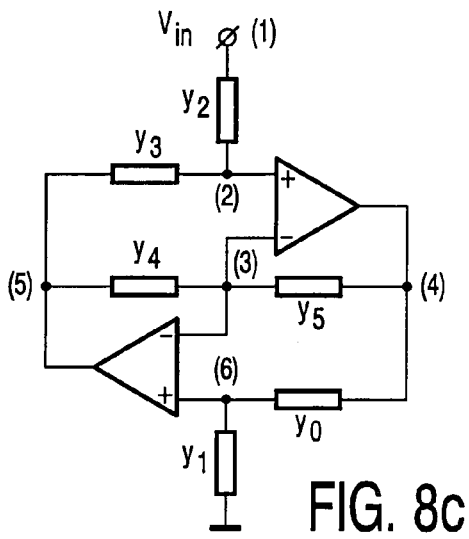
Figure 8B:
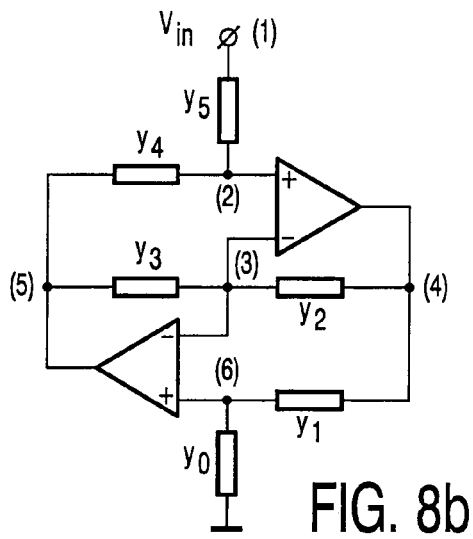
Figure 8E:
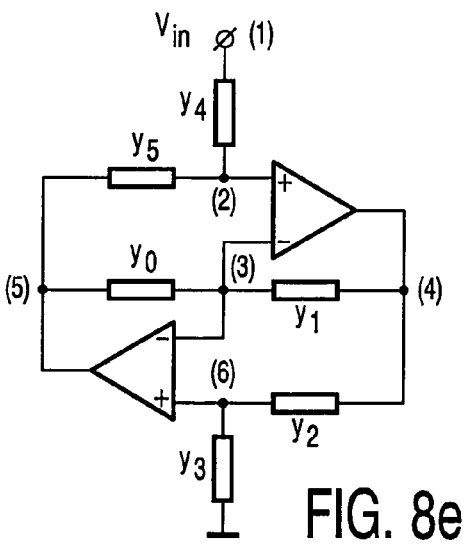
Figure 8F:
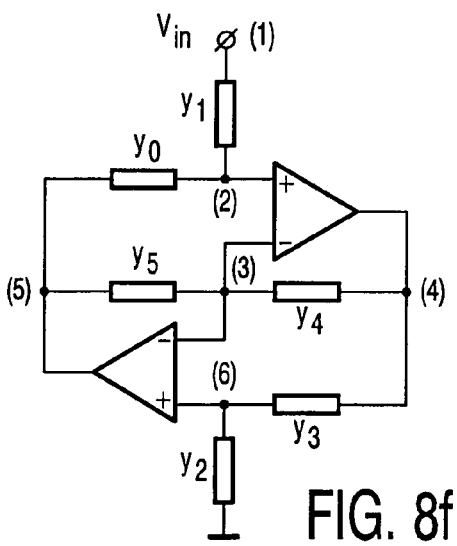
Figure 10:
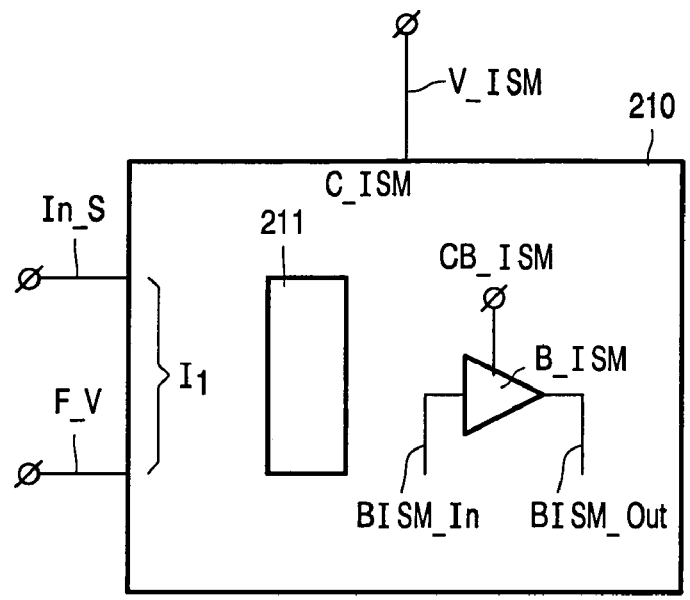
Figure 11:
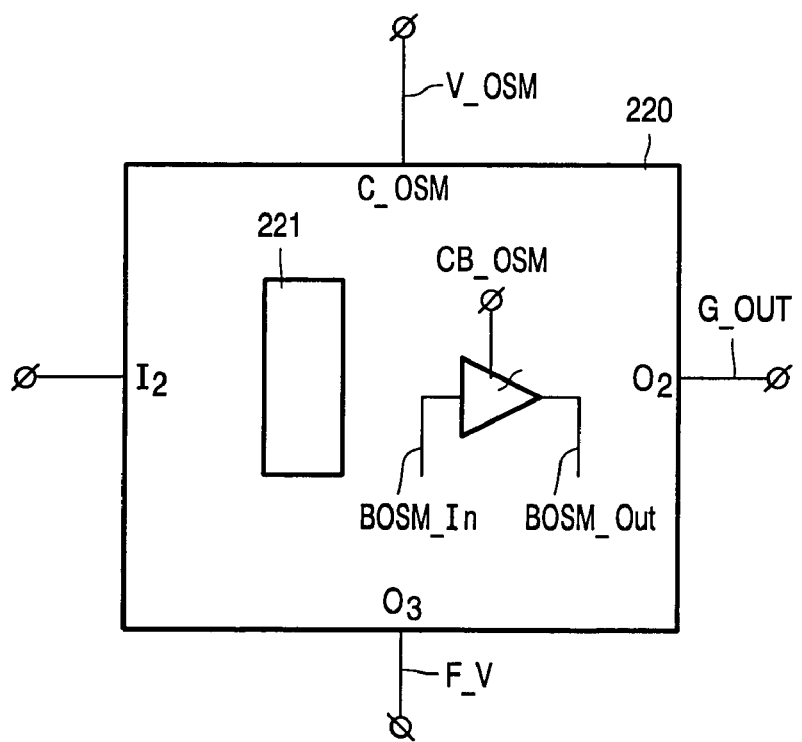

The above and other features and advantages of the invention will be apparent from the following description of exemplary embodiments of the invention with reference to the accompanying drawings, in which:

FIG. 1 depicts a block diagram of the analog reconfigurable cell, according to the invention, FIG. 2 depicts the coupling between any admittance to the first and the second plurality of switches according to one embodiment of the invention, FIG. 3 depicts the indefinite admittance matrix of the analog reconfigurable cell in all possible combinations in another embodiment of the invention, FIG. 4 depicts a differential voltage controlled voltage source according to one embodiment of the invention, FIG. 5 depicts the set of determinants when Nathan's transformation is performed in another embodiment of the invention, FIG. 6 depicts an analog reconfigurable cell in one embodiment of the invention, FIG. 7 depicts a decoder means in another embodiment of the invention, FIG. 8 depicts a reconfigurable analog cell realized with Generalized Immittance Converters in an embodiment of the invention, FIG. 9 depicts a block diagram of the arrangement comprising the reconfigurable analog cell in another embodiment of the invention, FIG. 10 depicts the Input Selection Means in an embodiment of the invention, FIG. 11 depicts the Output Selection Means in another embodiment of the invention.

FIG. 1 shows a block diagram of the analog reconfigurable cell (RAC) 100, according to the invention. The RAC 100 comprises an input In, an output Out and a control input Control_In. When an analog input signal In_S is applied at the input In, through the output Out is transmitted an output vector of signals Out_V that is the result of the input signal In_S processing. The dependence between Out_V and In_S determines a transfer function of the RAC 100 having a well-defined set of poles and zeroes. If the transfer function is represented by a rational fraction then the roots of the denominator represent the poles and the roots of the nominator represent the zeroes. The RAC 100 further comprises a plurality of admittances $Y_{ab}$ each of them having a first terminal (a) and a second terminal (b) and a plurality of switches SW, each of them having a first switch terminal SW1, a second switch terminal SW2 and a control terminal (CS_RAC). Each of the switches has an ON state when the first switch terminal SW1 is coupled to the second switch terminal such that a signal that is present at the first switch terminal is also present at the second switch terminal SW2. Each of the switches has also an OFF state when the input switch terminal SW1 is not coupled to the switch output terminal SW2. The two states of the plurality of switches are controlled by binary signals having a HIGH state or logical 1 and a LOW state or logical 0, the binary signals being received through the control input Control_In. One of the states of the binary signals determines the ON state of any switch while the other state determines the state OFF of any switch. For example, if logical 1 determines the ON state then logical 0 determines the OFF state and reciprocally. For convenience the ON state of a logical switch will be determined by a logical 1. The plurality of switches further comprises a first plurality of switches and a second plurality of switches for making different couplings within the RAC 100. The RAC 100 further comprises a plurality of internal nodes (1, 2, 3, 4, 5, 6, 7), one of the plurality of nodes being designated as the reference node. Thereon, the reference node is considered to be the node 7. Each of the first terminals of the admittance $y_{ab}$ (a) is coupled to the first switch terminals SW1 of the first plurality of switches and each of the second terminals (b) of the admittance $y_{ab}$ (b) is coupled to the first switch terminals of the second plurality of switches. The second switch terminal SW2 of the first and second plurality of switches are coupled to the nodes (1, 2, 3, 4, 5, 6, 7). In a preferred embodiment shown in FIG. 2 any admittance is wired connected to the switches but this does not exclude that the coupling could be realized by optical means, by radio means, by mutual coupling means.

When applying a control vector V_In through the control input Control_In only one of the first and the second pluralities of switches is ON. Under these circumstances, any admittance is coupled uniquely to a pair of nodes from the plurality of nodes realizing a particular circuit. From all possible input control vectors V_In, only the vectors that control the pluralities of switches in such a way that the poles of any particular circuits are almost identical to each other are selected. In other words there are realized only circuits with almost the same poles but with different zeroes. This means that with the same plurality of admittances, different transfer functions can be realized as low-pass, high-pass, band-pass, band-reject and many more as will be seen further in this description. It should be pointed out here that the transfer functions could have no poles and zeroes as a constant amplification e.g. In these cases the input control vectors V_In determine different circuits having transfer functions with the same denominator. A possible mathematical description of the RAC 100 is that using the Indefinite Admittance Matrix (IAM), a matrix characterized in that the determinants of all it's first order minors are equal to each other. A first order minor of a matrix is another matrix that is obtained by deleting one row and one column from the initial one. The determinants of the first order minor of the IAM determine the poles of any transfer function of the circuit. Under this circumstances an even permutation between the lines and columns of the IAM would maintain the poles of the circuit. An even permutation between rows and columns as used in this description means that two rows are interchanged and two columns are interchanged, too. Two or more even permutations realizes a set of even permutations. A first set of even permutations (P1) is achieved e.g. by interchanging the columns corresponding to the node 2 with that corresponding to the node 1 and that corresponding to the node 3 with that corresponding to the reference node 7. The same group of permutations is then applied to the corresponding lines, e.g. lines 2 and 1, and lines 3 and 7. Furthermore the above mentioned method could be applied with respect to another set of even permutations (P2) applied to the lines and columns referring to the nodes 4 and 5, and 6 and 7. Starting from an initial IAM characterizing a cell as described above and applying successively P1 first followed by P2 a total number of 12 distinct IAM are obtained.

FIG. 3 depicts the IAM of the analog reconfigurable cell 100 in all 12 possible combinations in another embodiment of the invention. The figures above and on left side of each IAM represent the nodes of the RAC 100, the node 7 being considered as the reference one. The index added to any admittance is a direct indication that that admittance is coupled to the respective nodes e.g. $y_{35}$ means that that admittance is coupled to the nodes 3 and 5. Furthermore $y_{35}=y_{53}$ because they represent the same admittance. The IAM a) in the above mentioned figure describes an initial state of the RAC 100. When P1 is applied the IAM shown in b) is obtained. If now P2 is applied the IAM in c) is obtained and so on. If in the case of IAM k) P2 is applied then the circuit described by the IAM a) is obtained. In this way a number of 12 circuits can be realized. It should pointed out here that applying successively the same set of permutation P1 or P2 in one state the IAM is not changing.

The above-described cell 100 comprises only passive admittances and thus it characterizes a passive filter. For many reasons as dynamic range, losses, active filters are preferred instead of passive ones. In one preferred embodiment of the invention presented in FIG. 4 a first and a second Differential Voltage Control Voltage Source (DVCVS) 300 are used. The first DVCVS 300 comprises a first input P_In coupled to the node 1, a second input N_In coupled to the node 2 and a first output OA coupled to the node 3. The second DVCVS 300 comprises a third input P_In coupled to the node 4, a fourth input N_In coupled to the node 5 and a second output OA coupled to the node 6. The DVCVS 300 are characterized in that they have a relatively very high input impedance, a relatively very low output impedance and a relatively very high voltage gain. Preferably the DVCVS 300 are Operational Amplifiers (OAs). It should be pointed out here that the same characteristics as that obtained with the above mentioned model is obtained by e.g. connecting in cascade a transconductance amplifier with a current to voltage converter and a high gain voltage amplifier and many other configurations.

When DVCVS 300 are used it is possible to simplify the IAM according to Nathan's transformation as follows:
  columns 1 and 2 are added together and one of them is eliminated,
  columns 4 and 5 are added together and one of them is eliminated,
  line 3 and line 6 are eliminated.

In FIG. 5 the set of the determinants obtained after performing Nathan's transformation is presented. In FIG. 5 the lines and the columns corresponding to the reference node were omitted in order to clearly show that the determinant determines the poles of the RAC 100. They can be directly used in determining the transfer functions from any node of the RAC as it will be presented further in this description.

Because the total number of switches could be very large it is impractical to use an input control vector V_In having the same component number as the number of switches.

That is why in a preferred embodiment of the invention a decoder is used as shown in FIG. 7.

The decoder comprises an input where the first control vector V_In is received. The decoder further comprises an output where the control signals for controlling the state of the switches SW are transmitted.

Considering that the RAC 100 has 7 nodes and the previously described P1 and P2 are applied consecutively then a total number of 12 RAC 100 configurations are obtained. In this case a V_In vector having 4 bits is necessary because it can generate 16 combinations, covering the necessity of the RAC (100). Noting each component of V_In as $S_i$, i=0 . . . 11, then the following table is obtained.

TABLE 1

| State | $C_1$ | $C_5$ | $C_9$ | $C_{11}$ | $C_{13}$ | $C_{15}$ | $C_{16}$ | $C_{17}$ | $C_{18}$ | $C_{19}$ | $C_{20}$ | $C_{24}$ | $C_{26}$ | $C_{28}$ |
|---|---|---|---|---|---|---|---|---|---|---|---|---|---|---|
| $S_0$ | 1 | 1 | 1 | 0 | 1 | 0 | 1 | 0 | 1 | 0 | 0 | 1 | 1 | 0 |
| $S_1$ | 0 | 1 | 0 | 1 | 1 | 0 | 0 | 1 | 1 | 0 | 0 | 1 | 1 | 0 |
| $S_2$ | 0 | 0 | 0 | 1 | 1 | 1 | 0 | 0 | 0 | 0 | 1 | 1 | 0 | 1 |
| $S_3$ | 1 | 0 | 1 | 1 | 0 | 1 | 0 | 0 | 0 | 1 | 0 | 1 | 0 | 1 |
| $S_4$ | 1 | 1 | 1 | 1 | 0 | 0 | 0 | 1 | 0 | 1 | 0 | 0 | 1 | 1 |
| $S_5$ | 0 | 1 | 1 | 0 | 1 | 0 | 1 | 0 | 0 | 0 | 1 | 0 | 1 | 1 |
| $S_6$ | 0 | 0 | 1 | 0 | 1 | 0 | 1 | 0 | 1 | 0 | 0 | 1 | 1 | 0 |
| $S_7$ | 1 | 0 | 0 | 1 | 1 | 0 | 0 | 1 | 1 | 0 | 0 | 1 | 1 | 0 |
| $S_8$ | 1 | 1 | 0 | 1 | 1 | 1 | 0 | 0 | 0 | 0 | 1 | 1 | 0 | 1 |
| $S_9$ | 0 | 1 | 1 | 1 | 0 | 1 | 0 | 0 | 0 | 1 | 0 | 1 | 0 | 1 |
| $S_{10}$ | 0 | 0 | 1 | 1 | 0 | 0 | 0 | 1 | 0 | 1 | 0 | 0 | 1 | 1 |
| $S_{11}$ | 1 | 0 | 1 | 0 | 1 | 0 | 1 | 0 | 0 | 0 | 1 | 0 | 1 | 1 |

In Table 1, $C_j$ represents the control variable of the switch $SW_j$, j=1 . . . 30. Furthermore:

$$C_2=C_1=\overline{C_1}; C_6=C_7=\overline{C_5}$$

$$C_1=C_4; C_5=C_8; C_{20}=C_{21}; C_{19}=C_{22}; C_{18}=C_2$$

$$C_6=\overline{C_5}; C_{10}=\overline{C_9}; C_{21}=\overline{C_{11}}; C_{14}=\overline{C_{13}}; C_{25}=\overline{C_{24}}; C_{27}=\overline{C_{26}}; C_{29}=\overline{C_{28}} \quad (1)$$

In the relations (1) a logical negate variable $C_j$ was noted as $\overline{C_j}$. From Table 1 the equations of the control variables can be derived as follows:

$$C_1 = S_0+S_3+S_4+S_7+S_8+S_{11}$$

$$C_5 = S_0+S_1+S_4+S_5+S_8+S_9$$

$$C_9 = S_0+S_3+S_4+S_5+S_6+S_9+S_{10}+S_{11}$$

$$C_{11} = S_1+S_2+S_3+S_4+S_7+S_8+S_9+S_{10}$$

$$C_{13} = S_0+S_1+S_2+S_5+S_6+S_7+S_8+S_{11}$$

$$C_{15} = S_2+S_3+S_8+S_9$$

$$C_{16} = S_0+S_5+S_6+S_{11}$$

$$C_{17} = S_1+S_4+S_7+S_{10}$$

$$C_{18} = S_0+S_1+S_6+S_7$$

$$C_{19} = S_3+S_4+S_9+S_{10}$$

$$C_{20} = S_2+S_5+S_8+S_{11}$$

$$C_{24} = S_0+S_1+S_2+S_3+S_6+S_7+S_8+S_9$$

$$C_{26} = S_0+S_1+S_4+S_5+S_6+S_7+S_{10}+S_{11}$$

$$C_{28} = S_2+S_3+S_4+S_5+S_8+S_9+S_{10}+S_{11} \quad (2)$$

It should be pointed out here that depending on the binary code attached to any of the state $S_j$, j=0 . . . 11, the logical expressions (2) could be optimized using different criteria as the total number of logical gates used, occupied area within a chip, smaller number of variables used in any of the expressions (2). Furthermore, the expressions (2) can be implemented using logical gates, multiplexers, demultiplexers, memories.

In FIG. 6 the RAC 100, in one embodiment of the invention is presented. The switches $SW_i$ are represented only by their control input $K_i$, where the variables $C_i$ are applied, with i=1 . . . 30. The coupling between Control_In input and control terminals of the switches could be realized by a contact, but could otherwise be realized via a contact-less coupling, e.g. by optical coupling, a capacitive or inductive coupling, a thermal coupling, a radio waves coupling. It should be pointed out here that depending on states coding, the practical implementation of the relations could be optimized. Furthermore, in equations (2), "+" denotes logical OR operation. In order to not complicate the figure, OAs are not shown in this drawing but we must bear in mind that they are connected between to nodes 1,2,3,7 and 4,5,6,7, respectively.

In FIG. 6 the switch $K_{30}$ is shown that realizes, when it is ON, a direct coupling between nodes 2 and 4. This situation corresponds to the situation when the two OAs have a direct connection between one of their input nodes. An example of such circuit is the well-known active filter realization with Generalized Immittance Converters (GIC). In this case only 6 different circuits can be obtained and they are presented in FIG. 8.

The determinant of the circuits shown in FIG. 8 is $$D = y_0y_2y_4 + y_1y_3y_5 \quad (3)$$

Considering that the outputs of the RAC 100 realized as in FIG. 8 are nodes 4 and 5 then all possible transfer functions to be obtained are presented in Table 3.

TABLE 2

| Figure number | $V_5/V_{in}$ | $V_4/V_{in}$ |
|---|---|---|
| a | $y_0(y_3y_5 - y_2y_4)/D$ | $y_0y_2(y_4 + y_5)/D$ |
| b | $y_3(y_0y_4 - y_1y_5)/D$ | $y_1y_3(y_4 + y_5)/D$ |
| c | $y_2(y_1y_5 - y_0y_4)/D$ | $y_2y_4(y_0 + y_1)/D$ |
| d | $y_5(y_0y_2 - y_1y_3)/D$ | $y_3y_5(y_0 + y_1)/D$ |
| e | $y_4(y_1y_3 - y_0y_2)/D$ | $y_0y_4(y_2 + y_3)/D$ |
| f | $y_1(y_2y_4 - y_3y_5)/D$ | $y_1y_5(y_2 + y_3)/D$ |

If one chooses the following components:

$$y_0 = y_2 = y_4 = y_5 = G = \frac{1}{R} \quad (4)$$

$$y_1 = sC + G$$

$$y_3 = sC$$

then a second order active filter is obtained. In relations (4) G represents a conductance, R represents a resistance, C represents a capacitor and s is a complex variable. $y_1$ as appears in the second of the relations (4) is realized by a parallel connection between a capacitor C and a resistor of resistance R. In this particular case the transfer functions shown in Table 3 are obtained.

TABLE 3

| Figure number | $V_5/V_{in}$ | $V_4/V_{in}$ |
|---|---|---|
| a | $(sCG^2 - G^3)/D$ | $2G^3/D$ |
| b | $-s^2C^2G/D$ | $2(s^2C^2G + sCG^2)/D$ |
| c | $sCG^2/D$ | $G^2(sC + 2G)/D$ |
| d | $-G(s^2C^2 + sCG - G^2)/D$ | $sCG(sC + 2G)/D$ |
| e | $G(s^2C^2 + sCG - G^2)/D$ | $G^2(sC + G)/D$ |
| f | $-(s^2C^2G - G^3)/D$ | $G(sC + G)^2/D$ |

It is observed from Table 3 that, for example, circuit f) realizes a stop-band filter when the output node is considered to be the node 5 and, simultaneously, a band-pass filter when the output node is considered to be the node 4. Furthermore all well-known filter transfer functions as low-pass (circuit a) at the output 4), high-pass (circuit b) at the output 5), band-pass with no transmission zeroes (circuit c) at output 5), etc. In Table 4 the sign "–" denotes a 180° phase-shift between input and output. Furthermore, when other components are chosen, other transfer functions can be obtained. In order to enhance the flexibility of the RAC 100 the admittances are controllable. This is achieved using controllable admittances that are controlled with different control signals as voltages, currents, charges, frequency, optical signals, thermal signals, radio signals. When the controlling signal is the frequency and the admittances are only capacitors, the corresponding filter is a switched-capacitor filter. The controllable admittances are particularly important when higher order filters are necessary. From the point of view of sensitivity e.g. when a high order transfer is necessary this is partitioned into a product of first and second order transfer functions. Then the functions can be easily implemented cascading RAC 100, each of the RAC 100 implementing a filter with different set of pole and zeroes that are determined by the values of the admittances.

FIG. 9 depicts a block diagram of the arrangement 200 comprising the reconfigurable analog cell 100 in another embodiment of the invention. The arrangement 200 comprises a plurality of RAC 100 coupled to an Input Selection Means (ISM) 210 and to an Output Selection Means (OSM) 220. The ISM is controlled by a second input control vector V_ISM applied to a second control input C_ISM of the ISM 210. The OSM 220 is controlled by a third control vector V_OSM applied to a third control input C_OSM of the OSM (220). The ISM 210 further comprises a first plurality of ISM inputs I1 and a second plurality of ISM outputs O1. The ISM 210 selectively redirects an input vector of signals received at the first plurality of ISM inputs I1 to the second plurality of ISM outputs O1 for transmitting them to the inputs In of the plurality of RAC 100 under the control of the second input control vector V_ISM.

The OSM 220 comprises a first plurality of OSM inputs I2, a second plurality of OSM outputs O2 and a third plurality of OSM outputs O3. The OSM 220 selectively redirects an input vector of signals comprising the output signals Out transmitted by the plurality of RAC 100 to the second plurality of OSM outputs O2. The OSM 220 transmits a general output signal G_OUT trough the second plurality of outputs O2 and a vector F_V through the third plurality of outputs O3, the vector F_V being further transmitted to the first plurality of ISM inputs I1 under the control of the third control vector V_OSM.

The third plurality of OSM outputs O3 transmit feedback signals to the first plurality of ISM inputs I1 when higher order transfer functions are required. Otherwise, the signals transmitted via the second OSM output O2 are selected to be transmitted to the output of the arrangement G_OUT.

FIG. 10 depicts the Input Selective Means (ISM) 210 in an embodiment of the invention. The ISM 210 comprises a first multiplexing means 211 coupled to a first controllable amplifier means B_ISM. The first controllable amplifier means B_ISM comprises a first amplifier input BISM_In, a first amplifier output BISM_Out and a first amplifier control input CB_ISM. An input signal received at the first plurality of ISM inputs I1 is redirected to the first plurality of outputs O1 under the control of the second control vector V_ISM. The signal first passes through the multiplexing means and then it is processed by the first controllable amplifier means B_ISM. The first controllable amplifier means B_ISM has multiple roles e.g. amplifying in a controlled manner an input signal for compensating losses through a signal chain, adapting an input signal to the input of the RAC 100, etc. The overall amplification of the first controllable amplifier means B_ISM is controlled by a control signal applied to the first amplifier control input CB_ISM. The control is realized electrically, optically, thermally, the controlling signal being a voltage, a current, a charge, a temperature, an optical wave, a radio wave, a clock.

FIG. 11 depicts the Output Selective Means 220 in another embodiment of the invention. The OSM 220 comprises a second multiplexing means 221 coupled to a second controllable amplifier means B_OSM. The second controllable amplifier means B_OSM comprises a second amplifier input BOSM_IN, a second amplifier output BOSM_OUT and a second amplifier control input CB_OSM. The OSM 220 amplifies in a controllable way and selectively transmits the output signals Out_V received from the plurality of RAC 100 under the control of the third control vector V_OSM to the second plurality of OSM outputs O2 and to the third plurality of OSM outputs O3 and. When a higher order filter should be realized, the overall transfer function is factorized as a product of first and second order intermediate filters. Each of the intermediate filter is then implemented in a RAC 100 the output signals of the intermediate filters being coupled to the third plurality of OSM output O3 and returned to the first plurality of ISM inputs I1. The output of the last filter is directed through the second plurality of OSM output O2 in order to transmit the processed signal to the G_Out terminal.

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general-purpose processor. The invention resides in each new feature or combination of features.

What is claimed is:

1. A reconfigurable analog cell (RAC) (100) comprising an input (In), an output (Out) and a first control input (Control_In) for generating at the output a vector of at least one signal which is the result of at least one of a plurality of transfer functions (Out_V), having a set of poles, from an input signal (In_S) applied to the input, the reconfigurable cell (100) further comprising a plurality of admittances $y_{ab}$ each of them having a first terminal (a) and a second terminal (b), a plurality of switches (SW), each of them having a first switch terminal (SW1), a second switch terminal (SW2) each switch having an ON state, in which the first and the second switch terminals are connected together, and an OFF state in which the switch terminals are not connected to each other, each switch further having a control terminal (CS_RAC) for controlling the state of any switch SW by a binary signal received through the Control_In, the plurality of switches SW comprising a first plurality of switches and a second plurality of switches, a plurality of internal nodes (1, 2, 3, 4, 5, 6, 7), one of the nodes being designated as the reference node, characterized in that each of the first terminals (a) of the admittances $y_{ab}$ is coupled to the first terminals SW1 of the first plurality of switches, each of the second terminals (b) of the admittances $y_{ab}$ is coupled to the first terminals SW1 of the second plurality of switches, each one of the second switch terminal SW2 of the first plurality of switches and of the second plurality of switches is coupled to at least one node of the plurality of nodes, the arrangement being such that when a control vector V_In is applied through the Control_In only one of the switches from any plurality is ON, realizing a particular state of a plurality of possible states (PSPPS) of the RAC (100), each of the states defining a transfer function having the said set of poles.

2. A reconfigurable analog cell (100) as claimed in claim 1 characterized in that a change of the control vector V_In, applied to the control inputs (CS_RAC) of the first plurality of switches and to the control inputs (CS_RAC) of the second plurality of switches of the said particular state PSPPS of the RAC (100), generates either a second state of the RAC (100), wherein:

the admittances connected to a first node (1) in the said particular state PSPPS are connected to a second node (2) and reciprocally, the admittances connected to a third node (3) in the said particular state PSPPS are connected to the reference node and reciprocally, or a third state of the RAC (100), in the third state:

the admittances connected to a fourth node (4) in the said particular state PSPPS are connected to a fifth node (5) and reciprocally, the admittances connected to a sixth node in the said particular state PSPPS are connected to the reference node and reciprocally.

3. A reconfigurable analog cell RAC (100) as claimed in claim 1 wherein the RAC (100) further comprises a decoder means having a decoder input and a decoder output, the decoder input being coupled to the first control input (Control_In) and the decoder output being coupled to the control terminal (CS_RAC) of the switches (SW) for generating at the decoder output a decoder output vector depending on the first control vector (V_In) applied at the first control input (Control_In) for controlling the state of the switches.

4. A reconfigurable analog cell RAC (100) as claimed in claim 1 characterized in that the first node (1) is coupled to a first input terminal of a first Differential Voltage Controlled Source (DVCVS), the second node (2) is coupled to a second input terminal of the first Differential Voltage Controlled Source (DVCVS), the fourth node (4) is coupled to a third input terminal of a second DVCVS, the fifth node (5) is coupled to a fourth input terminal of the second DVCVS, the third node (3) is coupled to a first output terminal of the first DVCVS and the sixth node (6) is coupled to a second output terminal of the second DVCVS.

5. A reconfigurable analog cell (100) as claimed in claim 4, wherein the DVCVS are Operational Amplifiers (OA).

6. A reconfigurable analog cell (100) as claimed in claim 1 further comprising a first memory means for storing the input control vectors V_In.

7. A reconfigurable analog cell (100) as claimed in claim 1 wherein the values of the admittances $y_{ab}$ are controllable.

8. An arrangement (200) comprising a plurality of RAC (100) as claimed in claim 1, coupled to an Input Selection Means (ISM) (210) and to an Output Selection Means (OSM) (220), the ISM being controlled by a second input control vector (V_ISM) applied to a second control input (C_ISM) of the ISM (210) and the OSM (220) being controlled by a third control vector (V_OSM) applied to a third control input (C_OSM) of the OSM (220), the ISM (210) further comprising a first plurality of ISM inputs (I1) and a second plurality of ISM outputs (O1) for selectively redirecting an input vector of signals received at the first plurality of ISM inputs (I1) to the second plurality of ISM outputs (O1) for transmitting them to the inputs In of the plurality of RAC (100) under the control of the second input control vector V_ISM, the OSM (220) comprising a first plurality of OSM inputs (I2), a second plurality of OSM outputs (O2) and a third plurality of OSM outputs (O3) for selectively redirecting an input vector of signals comprising the output signals Out generated by the plurality of RAC (100) to the second plurality of OSM outputs (O2) for transmitting a general output signal (G_OUT) and to the third plurality of OSM outputs (O3) for transmitting a vector F_V to the first plurality of ISM inputs (I1) under the control of the third control vector V_OSM.

9. An arrangement (200) as claimed in claim 8 wherein the ISM (210) further comprises a first multiplexing means (211) coupled to a first controllable amplifier means (B_ISM) comprising a first amplifier input (BISM_In), a first amplifier output (BISM_Out) and a first amplifier control input (CB_ISM) for selectively amplifying and transmitting the input vector of signals received at the first plurality of input (I1) through the first controllable amplifier means (B_ISM) to the second plurality of ISM output (O1) under the control of the second control vector (V_ISM).

10. An arrangement (200) as claimed in claim 8 wherein the OSM (220) further comprises a second multiplexing (221) means coupled to a second controllable amplifier means (B_OSM) comprising a second amplifier input (BOSM_IN), a second amplifier output (BOSM_OUT) and a second amplifier control input (CB_OSM) for selectively amplifying and transmitting the output signals Out_V transmitted by the plurality of RAC (100) under the control of the third control vector V_OSM to the third plurality of OSM output (O3) and to the second plurality of OSM output (O2).

11. An arrangement as claimed in claim 8 characterized in that the ISM control input (C_ISM) and the OSM control input (C_OSM) are conceived to receive binary vectors.

12. An arrangement as claimed in claim 8, further comprising a second memory means for storing the control vectors (V_ISM) and (V_OSM).

13. An arrangement as claimed in claim 8 integrated on a single chip.

* * * * *